United States Patent
Gmajnic et al.

(10) Patent No.: US 9,927,496 B2
(45) Date of Patent: Mar. 27, 2018

(54) APPARATUS AND METHOD FOR THE CONTACTLESS DETECTION OF VEHICLES

(71) Applicant: MobiliSis GmbH, Heppenheim (DE)

(72) Inventors: Nikola Gmajnic, Varazdin (HR); Kresimir Mestric, Trnovec Bartolovecki (HR); Uli Vietor, Heppenheim (DE)

(73) Assignee: MobiliSis GmbH, Heppenheim (DE)

( * ) Notice: Subject to any disclaimer, the term of this patent is extended or adjusted under 35 U.S.C. 154(b) by 859 days.

(21) Appl. No.: 13/943,880

(22) Filed: Jul. 17, 2013

(65) Prior Publication Data

US 2014/0021947 A1 Jan. 23, 2014

(30) Foreign Application Priority Data

Jul. 19, 2012 (DE) .................. 10 2012 014 303

(51) Int. Cl.
| | |
|---|---|
| *G08G 1/01* | (2006.01) |
| *G01R 33/02* | (2006.01) |
| *G01V 3/08* | (2006.01) |
| *G08G 1/042* | (2006.01) |
| *G01R 33/09* | (2006.01) |

(52) U.S. Cl.
CPC .............. *G01R 33/02* (2013.01); *G01R 33/09* (2013.01); *G01V 3/087* (2013.01); *G08G 1/042* (2013.01)

(58) Field of Classification Search
CPC ........ G01R 33/02; G01R 33/09; G01V 3/087; G08G 1/042

USPC ................. 340/932.2, 933; 324/244; 705/13; 33/356

See application file for complete search history.

(56) References Cited

U.S. PATENT DOCUMENTS

| | | | | |
|---|---|---|---|---|
| 3,825,889 A | * | 7/1974 | Koerner ................ | G08G 1/042 340/938 |
| 4,361,202 A | * | 11/1982 | Minovitch ......... | B60K 31/0008 104/88.02 |
| 5,491,475 A | * | 2/1996 | Rouse .................... | G08G 1/042 324/244 |
| 5,880,682 A | * | 3/1999 | Soulliard ............... | G08G 1/042 324/207.13 |
| 6,292,112 B1 | * | 9/2001 | Bader .................... | G08G 1/042 246/202 |
| 6,476,610 B1 | * | 11/2002 | Wiegert .................. | G01V 3/15 324/225 |
| 8,630,789 B2 | * | 1/2014 | Speiser .................... | G08G 1/01 340/915 |
| 2002/0100178 A1 | * | 8/2002 | Smith .................... | G01C 17/38 33/356 |
| 2003/0011492 A1 | | 1/2003 | Owen et al. | |
| 2007/0050240 A1 | * | 3/2007 | Belani ..................... | G08G 1/14 705/13 |
| 2007/0257818 A1 | * | 11/2007 | Aubrey .................. | G07B 15/02 340/932.2 |
| 2009/0273340 A1 | * | 11/2009 | Stephanson ............ | G01R 33/10 324/202 |
| 2011/0133958 A1 | * | 6/2011 | Carboon ................ | G07C 5/006 340/932.2 |

(Continued)

*Primary Examiner* — Travis Hunnings
(74) *Attorney, Agent, or Firm* — ProPat, L.L.C.

(57) ABSTRACT

An apparatus and a method for the contactless detection of vehicles via one or more magnetometers for measuring the geomagnetic field, in which at least one magnetometer includes a device for measuring the gravitational field.

27 Claims, 9 Drawing Sheets

(56) References Cited

U.S. PATENT DOCUMENTS

| | | | | |
|---|---|---|---|---|
| 2011/0218940 A1* | 9/2011 | Bergstrom | ......... | G06Q 30/0284 705/418 |
| 2012/0007749 A1* | 1/2012 | Oldknow | ............... | G08G 1/017 340/933 |
| 2012/0075109 A1* | 3/2012 | Wang | ................... | G01C 21/165 340/686.1 |
| 2013/0110450 A1* | 5/2013 | Kulik | ..................... | G01C 17/38 702/141 |
| 2013/0262059 A1* | 10/2013 | Grbovic | ................... | G08G 1/14 703/6 |
| 2014/0232563 A1* | 8/2014 | Engler | ................... | G08G 1/017 340/933 |
| 2014/0343891 A1* | 11/2014 | Becker | .................. | G07F 17/246 702/150 |
| 2015/0161890 A1* | 6/2015 | Huntzicker | ............ | G08G 1/141 340/932.2 |

\* cited by examiner

APPARATUS AND METHOD FOR THE CONTACTLESS DETECTION OF VEHICLES

CROSS-REFERENCE TO RELATED APPLICATIONS

This application claims priority to German Patent Application No. 10 2012 014 303.6 filed Jul. 19, 2012 which is hereby incorporated herein by reference in its entirety.

FIELD OF THE INVENTION

The present invention relates to an apparatus and a method for the contactless detection of vehicles, wherein one or more magnetometers are used for measuring the geomagnetic field.

BACKGROUND OF THE INVENTION

The use of magnetometers, particularly of induction loops, for the contactless detection of vehicles is known from the prior art. Since the installation of induction loops is space-consuming and complex, there is an intensive search for alternative concepts that use compact magnetometers, in particular magnetoresistive sensors. Attempts to date have hitherto had only limited success. The reason for this is primarily that the measurement signal from compact magnetometers is proportional to the magnetic field strength at a physical point, i.e. the position of the actual sensor element. This means that the measurement signal from compact magnetometers cannot be used to distinguish whether a vehicle is situated immediately above or below the magnetometer or just in proximity thereto. The same applies to moving vehicles, i.e. it is not possible to use the measurement signal from a compact magnetometer to establish whether the vehicle is being moved past the magnetometer immediately above or below the magnetometer or with a lateral or horizontal offset of up to 20 meters. Accordingly, a compact magnetometer cannot be used to distinguish vehicle types, such as car, truck, etc., from one another with sufficient certainty in stationary and flowing traffic. In addition, the apparatuses based on compact magnetometers are susceptible to failure and have an error rate of greater than 3%.

Within the context of the present invention, the term "error rate" denotes any error that occurs during the sensing and classification of stationary or moving vehicles, particularly of vehicles moving in flowing traffic. Furthermore, the term "vehicle" within the context of the present invention covers various vehicle classes, particularly cars, cars with a trailer, trucks, trucks with a trailer, vans, buses, articulated trucks and motorcycles.

The error rate of the apparatus according to the invention is ascertained by comparative measurement, with the apparatus and simultaneously a reference method, such as a light barrier in conjunction with an automated digital image processing and pattern recognition system, being employed. Any false-positive or false-negative detection of a stationary or travelling vehicle and any false classification of a true-positive detection is rated as an error. Vehicles sensed by the apparatus are classified into eight or nine categories, for example: car, car with trailer, truck, truck with trailer, van, bus, articulated lorry, motorcycle and miscellaneous. The error rate denotes the ratio of all of the errors to all detection processes. A false-positive detection can occur when the apparatus incorrectly indicates an entry process for a parking space in a parking lot even though a vehicle movement is taking place just on an adjacent parking space. In the case of a false-negative detection, a stationary or travelling vehicle is incorrectly not recorded.

One of the causes of errors in the magnetic-field-based detection of vehicles is that the known apparatuses involve the magnetic field not being measured separately according to the spatial directions or vectorial fractions. The reason for this is primarily that when the known apparatuses are installed the magnetometers are not fitted in a precisely defined spatial orientation. Even though precise alignment of the magnetometers does not face any fundamental obstacles, the work involvement associated therewith is considerable. A further problem is that ground settlement, thermal effects or road damage in the course of a few months to several years means that the orientation of the magnetometers can change and the original alignment settings are lost.

In Northern latitudes, such as Northern and Central Europe, the vertical component of the Earth's magnetic field is greater than the horizontal component. On the geomagnetic equator, which runs through the North of Brazil and Nigeria, inter alia, the vertical component of the Earth's magnetic field is infinitesimally small, on the other hand. Within the context of the present invention, the terms "vertical component" and "horizontal component" have their usual meaning and relate to directions that point radially away from the Earth's center at the respective geographical location, or are situated in a plane that is oriented parallel to the ground or perpendicular to the vertical component. The horizontal component of the Earth's magnetic field is directed outside the globe, apart from slight geographical deviations from the geomagnetic North Pole to the geomagnetic South Pole. The metal parts of a vehicle shield the Earth's magnetic field and/or distort the Earth's magnetic field. Frequently, the Earth's magnetic field is altered such that the magnetic field strength or the magnetic field lines are attenuated in directionally dependent fashion in the surroundings of the vehicle. When a vehicle, such as a car or a truck, is moved past a physically fixed magnetometer for measuring the Earth's magnetic field, the magnetometer records a temporally varying, transient or sudden decrease in the magnetic field strength when the vehicle passes. As soon as the vehicle has passed the magnetometer completely and is moving away, the magnetic field strength and hence the output signal from the magnetometer rise back to the previous value or level. Some vehicle components contain magnetizable materials, such as soft iron, which are tracked or focus the field lines of the Earth's magnetic field. When such a vehicle component is driven past a magnetometer at a distance of up to a few meters, this magnetometer records a temporally varying, transient or sudden increase in the magnetic field strength. The speed at which the attenuation or gain in the Earth's magnetic field takes place at the location of the magnetometer is dependent firstly on the speed of the vehicle and secondly on the angle between the direction of movement of the vehicle and the direction of the magnetic field lines. For the vertical component of the Earth's magnetic field, this angle is always 90°. For the horizontal component, on the other hand, this angle can vary between zero and 180°. Depending on the angle at which the vehicle moves in relation to the horizontal component of the Earth's magnetic field, the horizontal component of the Earth's magnetic field is attenuated or amplified to a greater or lesser extent in the surroundings of the vehicle. This means that the time-based derivation or the time-based differential of the horizontal component of the Earth's magnetic field is dependent on the vehicle speed and the angle between the direction of movement of the vehicle and the horizontal component of the Earth's magnetic field.

The above explanations reveal that measurement of the Earth's magnetic field in a manner separated according to vectorial components, particularly separation into the vertical component and the horizontal component of the Earth's magnetic field, is advantageous and allows the measurement accuracy and detection sensitivity to be increased.

SUMMARY OF ADVANTAGEOUS EMBODIMENTS OF THE INVENTION

The present invention has the object of overcoming the above problems. In particular, the aim is to provide an apparatus and a method having an error rate of less than 3%.

BRIEF DESCRIPTION OF THE DRAWINGS

FIGS. 9 a and b graphically illustrate the physical orientation of a magnetometer.

DETAILED DESCRIPTION OF ADVANTAGEOUS EMBODIMENTS OF THE INVENTION

The first object of the present invention is achieved by an apparatus with one or more magnetometers for measuring the geomagnetic field, wherein the at least one magnetometer comprises a device for measuring the gravitational field.

Developments of the apparatus according to the invention are characterized in that:
  the apparatus comprises one or more groups of magnetometers, each group comprising two, three, four or more magnetometers arranged at a distance from one another in a direction of travel that is prescribed by transport engineering;
  the apparatus comprises one or more electronic evaluation modules that are equipped with an integrated circuit, such as a microprocessor, a digital signal processor (DSP), a Field Programmable Gate Array (FPGA) or an Application Specific Integrated Circuit (ASIC), and are connected to or integrated with the at least one magnetometer;
  the at least one electronic evaluation module comprises a nonvolatile digital memory, such as a Flash EEPROM;
  each of the magnetometers comprises at least one magnetic field sensor and at least one gravitation sensor/acceleration sensor;
  each of the magnetometers comprises three magnetic field sensors that are arranged such that the output signals from the three magnetic field sensors are each proportional to the magnetic field strength in three spatial directions that are not coaxial with respect to one another, preferably in three spatial directions that are orthogonal with respect to one another;
  the at least one magnetic field sensor is in the form of an integrated electronic circuit;
  the at least one magnetic field sensor is based on the magnetoresistive (MR), anisotropic magnetoresistive (AMR), giant magnetoresistive (GMR), tunnel magnetoresistive (TMR) or giant-magnetic inductance (GMT) effect;
  the at least one magnetic field sensor is in the form of a fluxgate magnetometer (Forster probe);
  each of the magnetometers comprises three gravitation sensors that are arranged such that the output signals from the three gravitation sensors are each proportional to the force of gravity in three spatial directions that are not coaxial with respect to one another, preferably in three spatial directions that are orthogonal with respect to one another;
  the at least one gravitation sensor is in the form of a microelectromechanical component (MEMS);
  the apparatus comprises a software or firmware program having a geometric algorithm for calculating the vertical and/or horizontal component of the geomagnetic field;
  the apparatus comprises a bus system, such as a CAN bus;
  the apparatus comprises a reception and transmission unit for mobile radio and/or a reception and transmission unit for Ethernet; and/or
  the at least one magnetometer is connected to the at least one electronic evaluation module via the Internet.

The second object of the present invention is achieved by a method for the contactless detection of vehicles, comprising the following steps:
(a) provision of one or more apparatuses, comprising one or more magnetometers for measuring the geomagnetic field and the gravitational field and also one or more electronic evaluation modules, wherein the magnetometers are arranged above or below the surface of a carriageway or a parking lot and are connected to the at least one evaluation module;
(b) transmission of the output signals from the magnetometers to the at least one evaluation module; and
(c) software-assisted processing of the output signals from the magnetometers in the at least one evaluation module and translation into readout signals.

Developments of the method according to the invention are characterized in that:
  the readout signals produced in step (c) are transmitted to an electronic control and/or information system by wire, by optical fiber or wirelessly;
  the magnetic field strength is measured in three spatial directions that are not coaxial with respect to one another, preferably in three spatial directions that are orthogonal with respect to one another;
  the gravitation or force of gravity is measured in three spatial directions that are not coaxial with respect to one another, preferably in three spatial directions that are orthogonal with respect to one another;
  in step (c) the vertical and/or horizontal component of the geomagnetic field is calculated from the strength and direction of the geomagnetic field, which are measured using the at least one magnetometer, on the basis of a geomagnetic transformation, the parameters of which are determined from the strength and direction of the gravitational field as measured using the magnetometer;

in steps (b) and (c) the output signals from two, three, four or more magnetometers arranged at a distance from one another in a direction of travel that is prescribed by transport engineering are transmitted to the evaluation module and are processed in order to produce readout signals;

in steps (b) and (c) the output signals from one or more magnetometers arranged above or below a first parking space in a parking lot and the output signals from one or more magnetometers arranged above or below a second, third and/or fourth parking space in the parking lot are transmitted to the evaluation module and are processed in order to produce readout signals, the second, third and/or fourth parking spaces being adjacent to the first parking space;

in step (c) the output signals are processed by employing a knowledge-based algorithm in conjunction with a database having prescribed parameters; and/or in step (c) the output signals are processed by employing an artificial neural network in conjunction with a database having prescribed weight parameters.

The invention also relates to a traffic control system, comprising one or more of the apparatus described above and one or more control devices, signal apparatuses and/or information systems connected to the at least one apparatus, such as traffic lights, light signal installations, barriers and navigation systems.

The present invention solves the above-described problem of an excessive error rate for the detection of vehicles by virtue, inter alia, of providing an apparatus and a method in which the strength of the geomagnetic field and/or the transient sudden alteration thereof by stationary or moving vehicles and the gravitational field or the force of gravity is measured on a quasi-continuous basis at a frequency of from a few Hertz to a few tens of thousands of Hertz and the strength and direction of the gravitational field used to separate the vertical and horizontal components of the geomagnetic field. Accordingly, the apparatus and the method of the present invention comprise automatic electronic direction calibration that dynamically compensates for any misalignments or tilting of the magnetometers used for measuring the Earth's magnetic field.

An important function of the electronic evaluation module is that of calculating, in step (c) of the method according to the invention, the vertical and/or horizontal component of the geomagnetic field from the strength and direction of the geomagnetic field, which are measured using the at least one magnetometer, on the basis of a geometric transformation, the parameters of which are determined from the strength and direction of the gravitational field as measured using the magnetometer.

Depending on the application of the present invention, particularly for the detection of moving vehicles in flowing traffic or for the detection of stationary and moving vehicles in restricted entrances and exits and also on parking lots, the strength of the Earth's magnetic field as measured by the magnetometers is processed and evaluated quasi-statically and/or dynamically. In the case of quasi-static evaluation, the strength of the Earth's magnetic field is measured at an arbitrarily stipulated reference time, possibly separately according to vertical and horizontal components, and the ascertained values are stored in an electronic memory, preferably in a Flash EEPROM. The strength of the magnetic field is measured again using a prescribed cycle time in the range from microseconds to a few seconds and the current values obtained are compared with the reference values held in the electronic memory. If the difference between the current and reference values exceeds a prescribed threshold value, a relevant event is assumed and software-based or firmware-based algorithmic further processing of the measured values is initiated.

The dynamic evaluation of the magnetic field strength measured using the magnetometers involves the magnetic field strength, possibly separated according to vertical and horizontal components, being derived or differentiated electronically on the basis of time. The time-based differential is formed by means of known electronic devices, such as a differentiator or an inverting amplifier, with a time constant in the range from a few microseconds to a few hundred milliseconds. If the time-based differential exceeds a prescribed threshold value, a relevant event is assumed and software-based or firmware-based algorithm further processing of the measured values is initiated.

The invention allows travelling and stationary vehicles, particularly vehicles parked in parking lots, such as cars and trucks, to be detected and, if necessary, classified with a high level of reliability.

Figure 1:
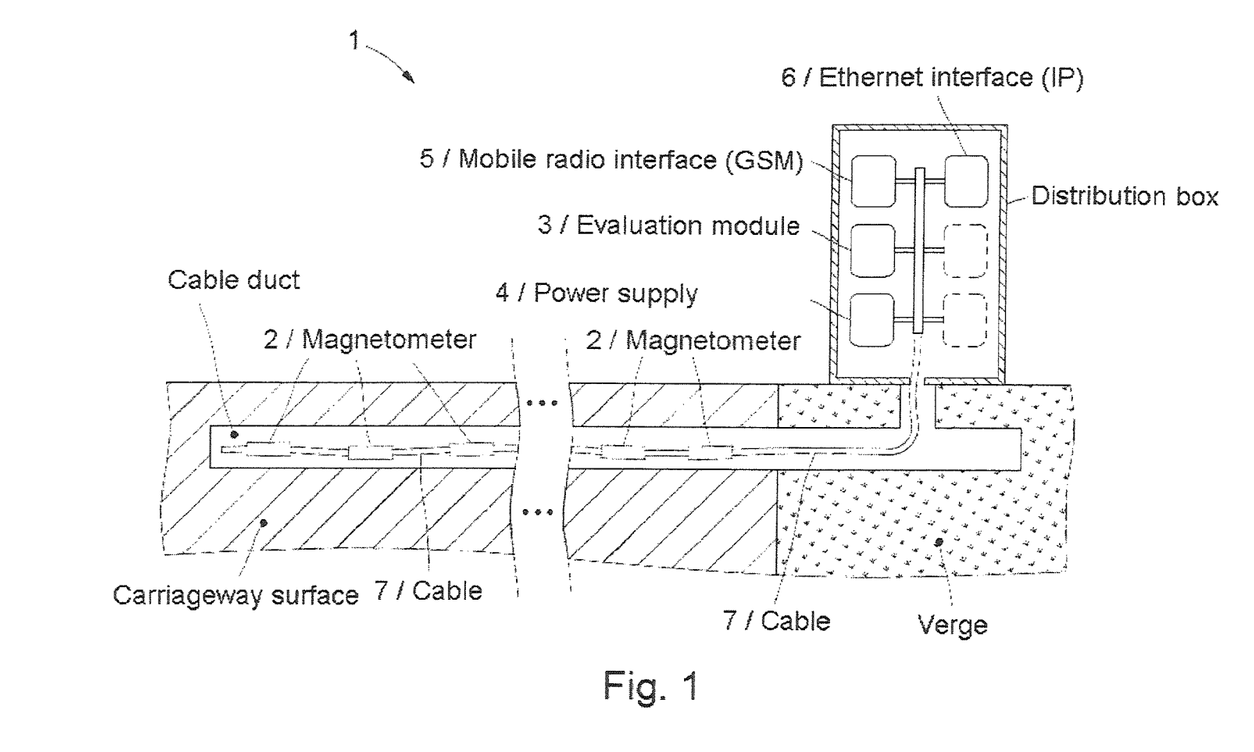
FIG. 1 is a schematic illustration of a sectional view of an carriageway equipped with an exemplary inventive apparatus.
Figure 2:
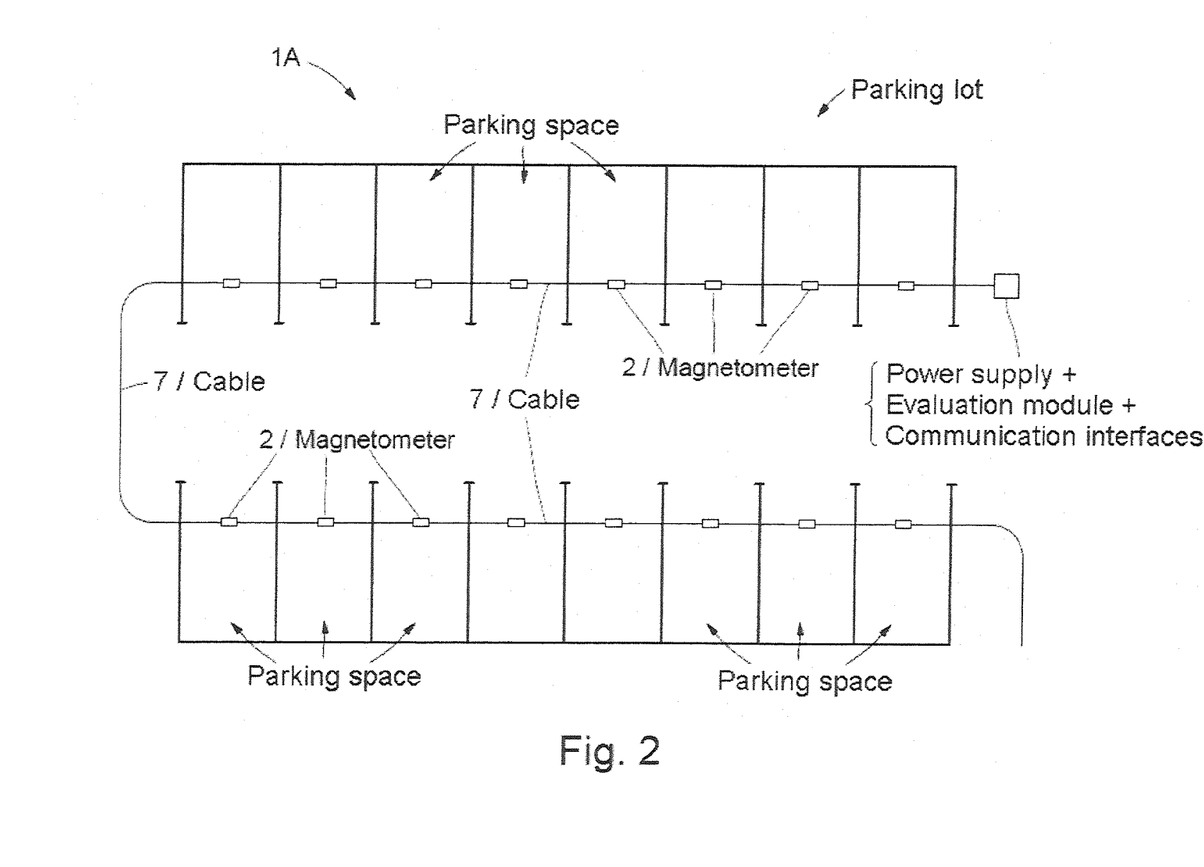
FIGS. 2 and 3 schematically illustrate a plan view of parking lots with exemplary apparatuses.
Figure 3:
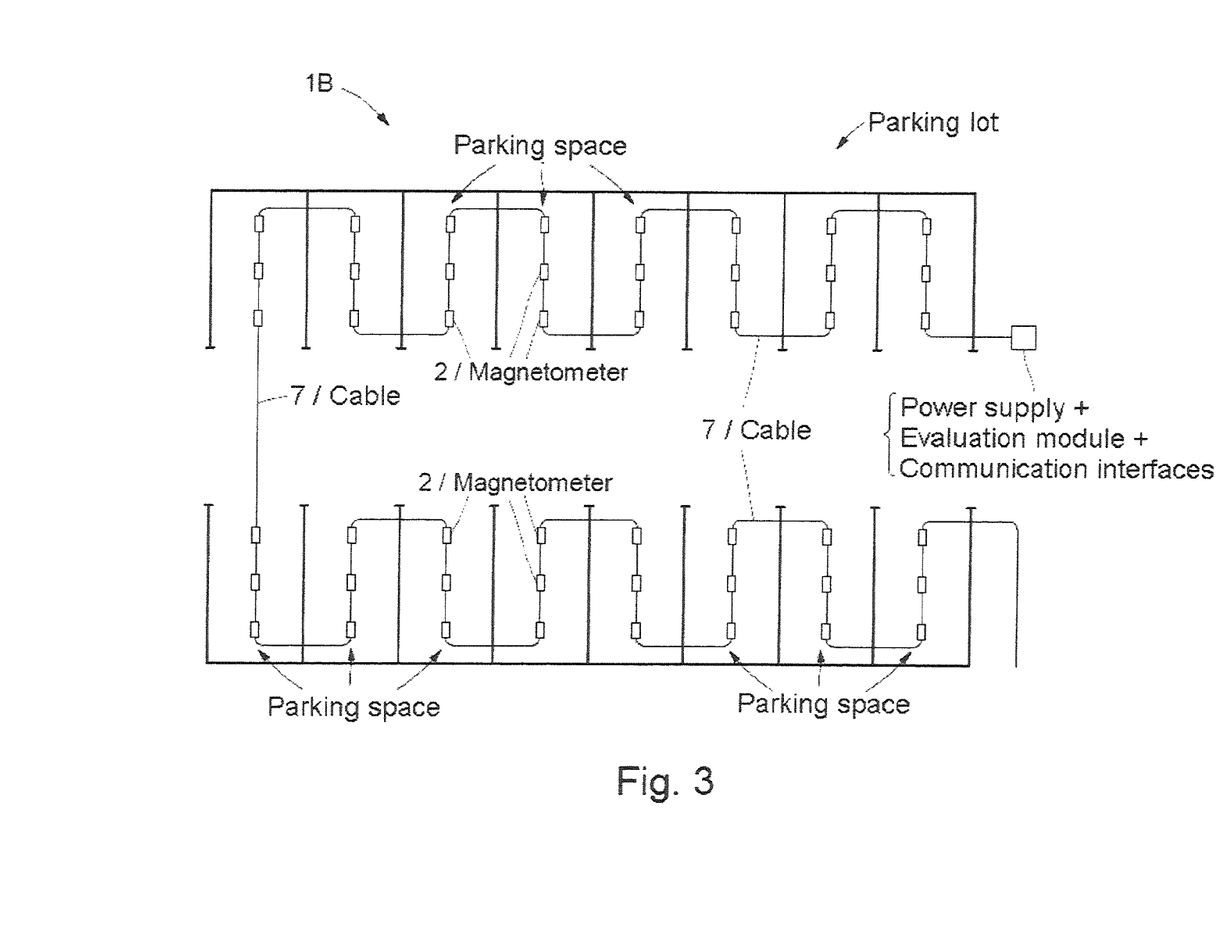
Figure 4:
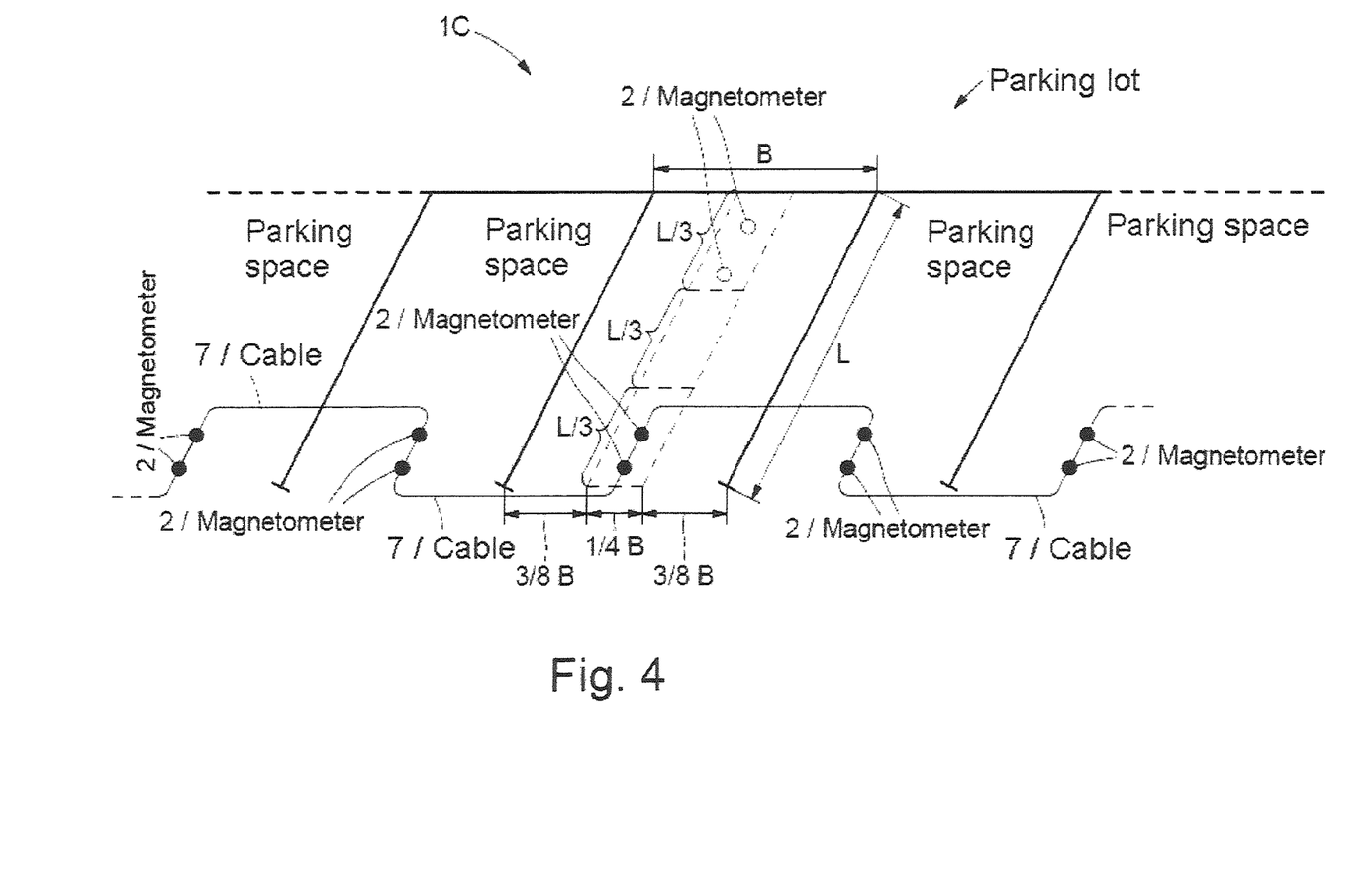
FIG. 4 schematically illustrates an advantageous arrangement of magnetometers in a parking lot.
Figure 5:
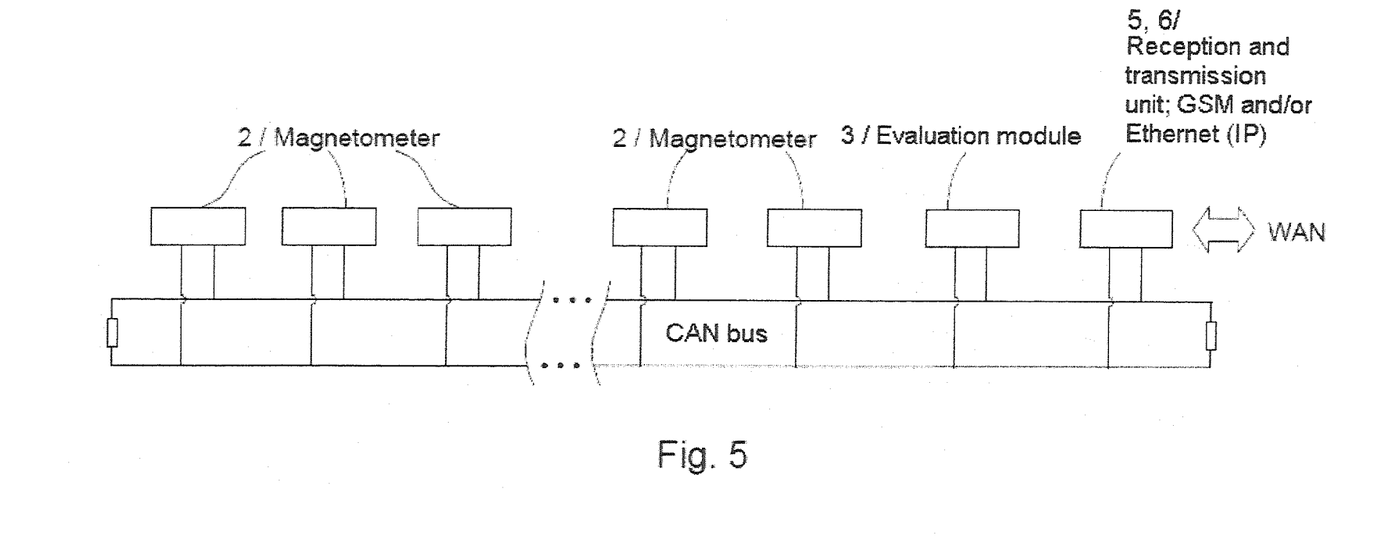
FIG. 5 provides a block diagram with of an apparatus for the contactless detection of vehicles.
Figure 6:
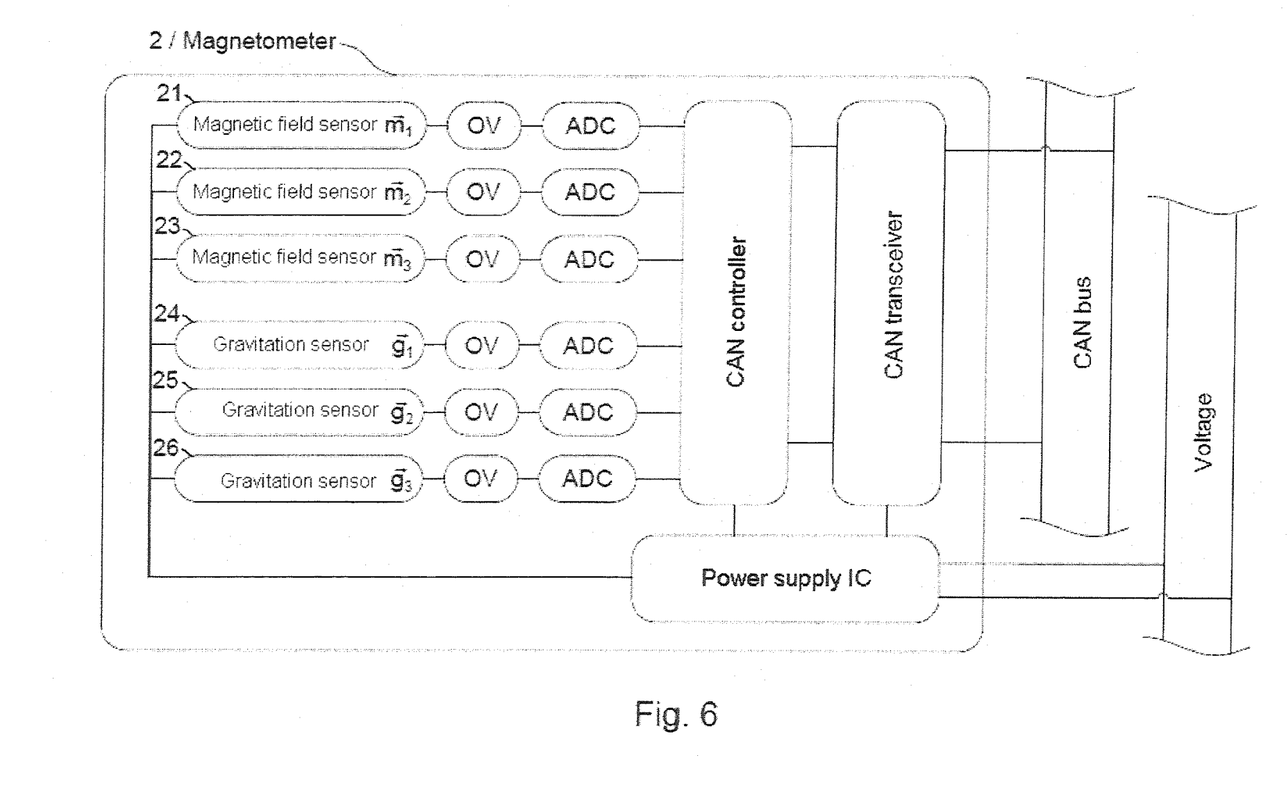
FIGS. 6 and 7 are circuit diagrams.
Figure 7:
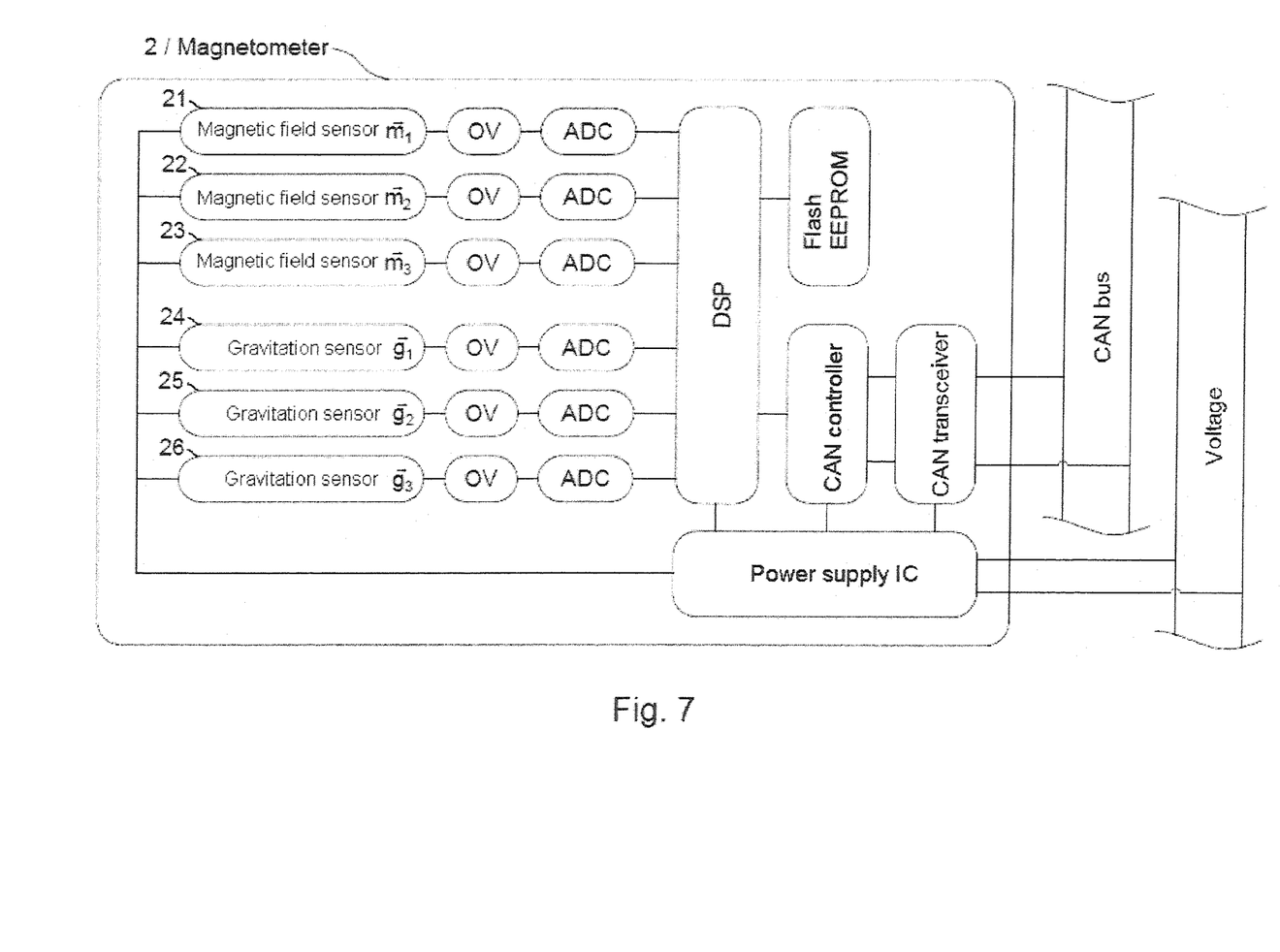
Figure 8:
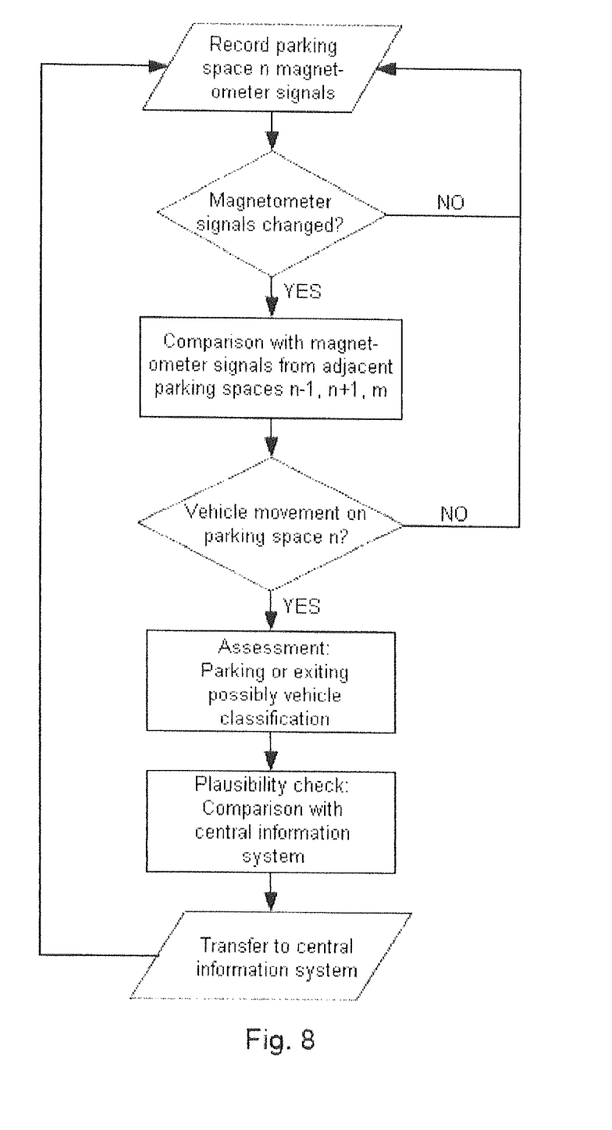
FIG. 8 provides a flowchart of the signal and data processing.

As noted above, the invention is explained in more detail below with reference to figures, in which:

FIG. 1 shows a sectional view of a carriageway that is equipped with an apparatus having a plurality of magnetometers for detecting vehicles;

FIGS. 2 and 3 show plan views of parking lots with apparatuses for the contactless detection of vehicles;

FIG. 4 shows a preferred arrangement of magnetometers within a parking space in a parking lot;

FIG. 5 shows a block diagram with essential components of an apparatus for the contactless detection of vehicles;

FIGS. 6 and 7 show circuit diagrams with essential function blocks;

FIG. 8 shows a flowchart of the signal and data processing; and

Figure 9A:
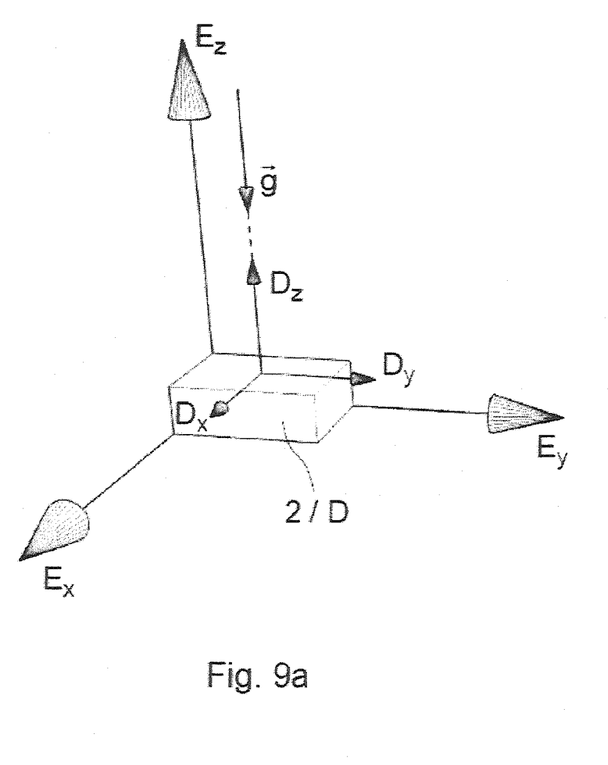
Figure 9B:
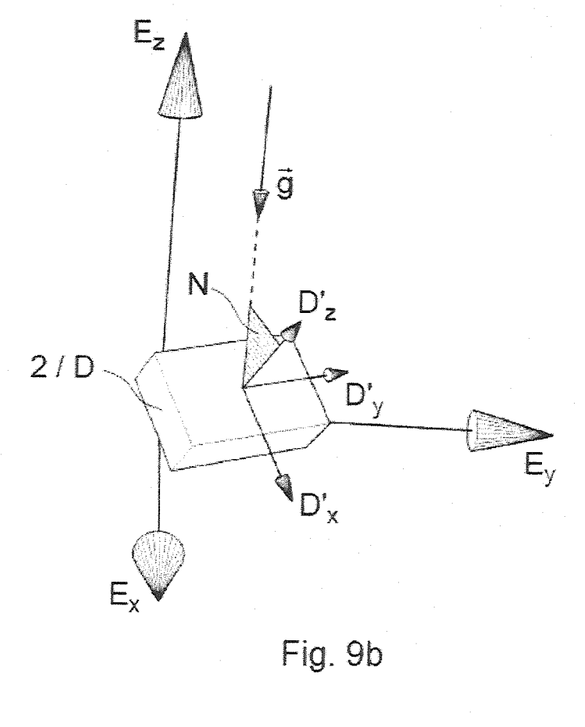

FIGS. 9 a and 9b show the physical orientation of a magnetometer.

FIG. 1 schematically shows a sectional view of a carriageway or a parking lot that is equipped with an apparatus 1 according to the invention. The exemplary apparatus 1 shown in FIG. 1 comprises a plurality of magnetometers 2 for measuring the magnetic field strength and the gravitational field. Within the context of the invention, however, apparatuses are also provided that have just one magnetometer. For the purpose of installing the apparatus 1, a recess or a cable duct in the form of a groove, a horizontal hole or a tap hole is first of all made in the carriageway surface. An "autarkic magnetometer" or a cable 7 having one or more magnetometers 2 connected to the cable 7 for measuring the magnetic field strength and the gravitational field is placed or introduced into the recess. The term "autarkic magnetometer" is explained in more detail further down. If the apparatus comprises a plurality of magnetometers 2, adjacent magnetometers 2 may be arranged along the cable 7 at the same distance or at varying distances from one another in each case. Typically, the distance between adjacent magnetometers is 30 cm to 20 m, 30 cm to 10 m, 30 cm to 3 m and preferably 30 cm to 100 cm. The cable 7 comprises at least one wire, preferably two or more wires, for power supply and at least one, preferably two or more, wire(s) for the transmission of analog and/or digital signals. Preferably, the cable 7 is designed on the basis of the Controller Area Network (CAN) standard. The cable 7 connects the magnetometers 2 to a power supply 4, to an evaluation module 3 and to one or more communication interfaces 5, 6 or transmission and reception units, particularly to communication interfaces for mobile radio 5 and/or Ethernet 6. The communication interface for mobile radio 5 is equipped for operation on the basis of one or more of the current standards such as GSM (Global System for Mobile Communications), UMTS (Universal Mobile Telecommunications System) or LTE (Long Term Evolution). The power supply 4, the evaluation module 3 and the communication interface 5, 6 are arranged in a distribution box that is installed in freestanding fashion next to the carriageway or is embedded in the ground. In one expedient development of the invention, the at least one magnetometer 2 is connected to the at least one electronic evaluation module 3 via a Wide Area Network (WAN), particularly via a wired, optical-fiber or wireless Internet connection, for example via LTE (Long Term Evolution).

The connection of the magnetometer 2 to a Wide Area Network, particularly to the Internet, provides the basis for software-assisted services, which are usually denoted by the term "Software as Service"—"SAS" for short—in expert circles. In this case, the output signals from the magnetometers 2 or possibly the output signals from the evaluation modules 3 that are installed locally with the magnetometers 2 or that are integrated in the magnetometers 2 are transmitted to one or more central servers and are processed on these servers in software-assisted fashion in order to obtain directly usable data for information and traffic control systems. If the output signals from the magnetometers 2 are transmitted to one or more central servers directly, the server or these servers act(s) as evaluation modules 3. The data obtained or conditioned in this manner are then transmitted to the user(s) via the Internet or provided for retrieval via the Internet. In respect of redundancy, maintenance, repair, error correction and updates for hardware and software, the SAS concept provides considerable potential for cost saving in comparison with conventional methods that are based on the use of specific hardware and software provided by the user.

In one particularly expedient development of the invention, the apparatus 1 comprises a solar panel and also a battery or a storage battery in order to provide the electrical power that is necessary for operating apparatus 1.

The invention furthermore provides apparatuses in which a power supply, preferably a battery or a storage battery, an evaluation module and also a communication interface particularly a reception and transmission unit for mobile radio, are integrated in the magnetometer. Such "autarkic" apparatuses or magnetometers are particularly simple to install by inserting the magnetometer into a sinkhole (taphole) drilled into the carriageway surface.

In a manner preferred according to the invention, two, three, four or more magnetometers are arranged at a distance from one another in a direction of travel that is prescribed by transport engineering, particularly along a line that runs centrally between the edges of a lane. Such an arrangement for the magnetometers improves the data quality significantly and allows the speed of moving vehicles in flowing traffic and also the distances or what are known as the gaps between two respective directly successive vehicles in flowing traffic to be determined. The gap between directly successive vehicles is used for controlling light signal installations or traffic lights at junctions, for example.

The invention furthermore proposes apparatuses in which a plurality of magnetometers or a plurality of groups of magnetometers are arranged at a distance from one another in a direction that runs essentially perpendicular to a prescribed direction of travel. Such a transverse arrangement is provided for detecting moving and stationary vehicles in multilane flowing traffic, in multilane entrances and exists and in parking lots. In addition to the opportunity to detect vehicles in multiple lanes, such transverse arrangement improves the signal quality and virtually completely eliminates errors caused by "crosstalk" from adjacent lanes. In this context, the term "crosstalk" denotes the circumstance in which a stationary or moving vehicle situated in a first lane brings about a significant output signal in a magnetometer that is arranged above or below a second lane, which is adjacent to the first lane.

In one particularly preferred embodiment, the apparatus according to the invention comprises a plurality of groups of magnetometers that are arranged below or above a plurality of lanes situated next to one another, each group comprising two, three, four or more magnetometers that are positioned at a distance from one another in a direction of travel that is prescribed by transport engineering, particularly along a line that runs centrally between the edges of the respective lanes. Such an apparatus combines the metrological opportunities described in the two paragraphs above and advantages for the detection of vehicles.

FIG. 2 shows a plan view of a parking lot with a plurality of parking spaces arranged in rows, said parking lot being equipped with an apparatus 1A according to the invention, wherein a respective magnetometer 2 is positioned in the carriageway surface of a parking space or above a parking space. All of the magnetometers 2 are connected by means of a cable 7 to a power supply, an evaluation module and one or more communication interfaces. The cable 7, including the magnetometer 2, can be laid in a cable duct or a groove cut into the carriageway surface. When laid in a groove in the carriageway surface, the cable 7 and the magnetometers 2 are covered or enveloped with a suitable material, such as a foam sheet, a foam tube or a polymeric foam compound, in order to protect them against mechanical and thermal action. Subsequent to this, the groove is filled and sealed with asphalt, bitumen or concrete.

FIG. 3 shows a plan view of a parking lot with a plurality of parking spaces arranged in rows and another expedient configuration of an apparatus 1B according to the invention, three magnetometers 2 being positioned in the carriageway surface of a parking space or above a parking space. The invention furthermore provides configurations in which two, four, five, six, seven or more magnetometers are arranged in the carriageway surface of a parking space or above a parking space. All of the magnetometers 2 are connected by means of a cable 7 to a power supply, an evaluation module and one or more communication interfaces. As FIG. 4 shows, the profile of the cable 7 is meandrous, with a cable segment that is arranged essentially rectilinearly and parallel to the longitudinal axis of the parking space being provided for each parking space in the parking lot.

In other expedient developments of the invention, a plurality of cable segments are laid in star or tree form, with a cable segment having one or more magnetometers being provided for each parking space in the parking lot and the cable segments of each parking space being connected to a common main cable.

The apparatus according to the invention is particularly suitable for the detection of vehicles, such as cars and trucks, in parking lots, in parking garages and on parking levels. In this case, provision is made for the magnetometers to be arranged or fitted in the carriageway surface of one or more stories or below one or more story ceilings. In one particularly expedient embodiment of the invention, the cable and the magnetometers are fitted on the underside of the story ceiling of a parking garage by means of retaining elements, such as cable clips and screws. In the case of such apparatuses according to the invention that are configured for parking garages, each magnetometer can be employed for sensing vehicles or for sensing vehicle movements above and below the respective story ceiling. For the purpose of processing the output signals from the magnetometers in the evaluation module, an appropriately modified piece of software or firmware is provided that discriminates between the output signals caused by vehicles above and below the story ceiling. This allows the installation complexity to be reduced by equipping only every second story ceiling with magnetometers and nevertheless sensing all vehicles and vehicle movements within the parking garage.

FIG. 4 shows a plan view of an apparatus 1C according to the invention for a parking lot with a preferred geometric arrangement of the magnetometers 2. The apparatus 1C comprises a plurality of groups containing two magnetometers 2 each, which are arranged within the parking spaces of the parking lot or within a reference area that is essentially coplanar with respect to the respective parking space, i.e. horizontal and situated above or below the surface of the carriageway of the parking space. The parking space and therefore the reference area have a rectangular or parallelogram shape with two parallel sides of length L and two parallel sides of length B. The two magnetometers 2 are arranged within a parallelogram or rectangular subarea, with a first side of length L and a second side of length B/4, that is situated centrally between the two sides L. In addition, the two magnetometers 2 are arranged within a front third (solid circles in FIG. 4) and/or a rear third (empty circles in FIG. 4) in the direction of the sides L, i.e. at a distance of from 0 to L/3 and/or 2·L/3 to L from one of the two sides B. As explained above, each parking space may be equipped with one, two, three, four, five, six, seven or more magnetometers 2 that are arranged within the parking space or within the reference area that is congruent with the parking space in the above manner. The arrangement that is preferred according to the invention for the magnetometers 2 centrally on the longitudinal axis and within a front or rear third of the parking space is advantageous because the front or rear axle and the engine of a vehicle distort the magnetic field of the Earth to a particularly great extent and bring about a correspondingly large measurement signal in the magnetometer.

FIG. 5 shows a block diagram with the essential functional components of a preferred embodiment of the invention, in which the magnetometers 2, the evaluation module 3 and the communication interface 5, 6 or the transmission and reception unit are electrically connected to one another in the manner of a serial bus system. In particular, the bus system is designed on the basis of the Controller Area Network (CAN) standard. The transmission of CAN signals requires at least one three-wire cable for the signals levels CAN high, CAN low and ground. For the sake of clarity, the schematic illustration in FIG. 5 shows only the cable wires for the signal levels CAN high and CAN low. For the same reason, FIG. 5 does not show the power supply and the associated cable wires or a distributor rail for the connection of the magnetometers 2, the evaluation module 3 and the communication interface 5, 6 to the power supply.

FIGS. 6 and 7 show a highly schematic illustration of an exemplary configuration of the essential circuit components of the magnetometer 2 for measuring the geomagnetic field and the gravitational field. Each of the magnetometers 2 comprises at least one magnetic field sensor 21 and at least one gravitation sensor 24. Preferably, each of the magnetometers 2 comprises three magnetic field sensors 21, 22, 23. Regardless of the number of magnetic field sensors, each magnetometer 2 preferably comprises three gravitation sensors 24, 25, 26. The magnetic field sensors 21, 22, 23 and the gravitation sensors 24, 25, 26 of a magnetometer 2 are arranged such that their output signals are each proportional to the magnetic field strength, or to the force of gravity in three spatial directions that are not coaxial with respect to one another, preferably in three spatial directions that are orthogonal with respect to one another. The three spatial directions that are not coaxial with respect to one another, and that are preferably orthogonal with respect to one another, in which the three magnetic field sensors 21, 22, 23 are respectively oriented are symbolized by the vectors $\vec{m}_1$, $\vec{m}_2$ and $\vec{m}_3$ in FIGS. 6 and 7. Similarly, three spatial directions that are not coaxial with respect to one another, and that are preferably orthogonal with respect to one another, in which the three gravitation sensors 24, 25, 26 are respectively oriented are symbolized by the vectors $\vec{g}_1$, $\vec{g}_2$ and $\vec{g}_3$.

Furthermore, FIGS. 6 and 7 show ordinary circuit elements, such as operational amplifiers (OV), analog-to-digital converters (ADC), a power supply IC, a bus controller, such as a CAN controller, a digital signal processor (DSP) and also a nonvolatile data memory, particularly a Flash EEPROM. The operational amplifiers (OV) and the analog-to-digital converters (ADC) are used to amplify the signal from the magnetic field sensors 21, 22, and from the gravitation sensors 24, 25, 26 and to convert it into a binary-encoded number, i.e. to digitize it. The digitized output signals from the magnetic field sensors 21, 22, 23 and the gravitation sensors 24, 25, 26 are transferred to the Bus controller or CAN controller and are transmitted via the signal wires of the bus or CAN cable to an electronic evaluation module, which is not shown in FIG. 5. The bus or CAN controller and the CAN bus line may have a transmission and reception circuit, such as a CAN transceiver, arranged between them that converts the output signals from the CAN controller and transmits them to the CAN bus line.

Expediently, a plurality of magnetic field sensors 21, 22, 23 and/or a plurality of gravitation sensors 24, 25, 26 are integrated in a microelectronic chip or a microelectromechanical circuit (MEMS). Accordingly, the terms "magnetic field sensor" and "gravitation sensor" cover discrete monofunctional sensor chips and also corresponding modules or circuit blocks from integrated circuits (ICs) with further function blocks within the context of the present invention.

In the configuration shown in FIG. 7, the digitized output signals from the magnetic field sensors 21, 22, 23 and the gravitation sensors 24, 25, 26 are processed by means of a microprocessor or digital signal processor (DSP) integrated in the magnetometer. Expediently, the microprocessor or DSP is connected to a nonvolatile memory, such as a Flash EEPROM, that is likewise integrated in the magnetometer. The nonvolatile memory or Flash EEPROM is used to store a program, such as an artificial neural network, for evaluating the digitized signals from the magnetic field sensors 21, 22, 23 and the gravitation sensors 24, 25, 26. In addition to the program, the nonvolatile memory or Flash EEPROM may store prescribed parameters, such as the weights for an artificial neural network.

Preferably, the apparatus according to the invention also comprises a software or firmware program with a geometric algorithm for calculating the vertical and/or horizontal component(s) of the geomagnetic field from the output signals from the at least one magnetic field sensor 21, 22, 23 and the at least one gravitation sensor 24, 25, 26. The software or firmware program is stored in a nonvolatile memory, such as a Flash EEPROM as described above.

In one particularly expedient embodiment of the invention, three magnetic field sensors, three gravitation sensors, operational amplifiers, analog-to-digital converters, power supply circuits and a bus interface are integrated in a chip.

FIG. 8 shows the essential steps that are executed for the electronic transmission, processing and analysis of the output signals from the magnetometers in an apparatus according to the invention that is configured for a parking lot, in the form of a flowchart. The signals are processed in cyclic loops in a manner similar to that in a programmable logic controller (PLC), the time required for executing one cycle—subsequently called cycle time varying depending on the number of magnetometers and on the number of vehicle movements or detection processes per unit time and typically being from a few microseconds to a few milliseconds. A first loop is used to ascertain whether the signals from the magnetometers of a first of a plurality of parking spaces in the parking lot exhibit a significant, in particular transient, abrupt change whose level exceeds a prescribed threshold value. If such a significant change occurs, the signals from the magnetometers of the second, third and/or fourth parking space adjacent to the first parking space are compared with the signals from the first parking space programmatically by means of a first algorithm and a decision is made as to whether or not a vehicle is being detected on the first parking space. In FIG. 8, the first, second, third and fourth parking spaces are symbolized by the symbols n, n−1, n+1 and m, respectively, with the second and third parking spaces n−1 and n+1 being situated in the same row to the left and right directly next to the first parking space n. By contrast, the fourth parking space m is situated in an adjacent row having its front end adjacent to the first parking space n. The symbols n, n−1, n+1 and m represent the number or the index of each parking space in the parking lot and correspond to whole numbers. The comparison of the magnetometer signals from adjacent parking spaces reduces the probability of false-positive detection on account of crosstalk from adjacent parking spaces almost to zero. If the apparatus assesses the signal change on the first parking space as positive detection or as the vehicle movement, the signals from the first parking space and possibly from the adjacent parking spaces are evaluated programmatically by means of a second algorithm, are classified as an entry or exit process, and possibly the vehicle category such as car, car with trailer, truck, truck with trailer, van, bus, articulated truck, motorcycle and miscellaneous, is ascertained. The first and second algorithms are preferably knowledge-based and use empirically ascertained parameters that are held in a nonvolatile memory.

FIGS. 9a and 9b show perspective views of physical orientations of a magnetometer D, the reference taken as a basis being a coordinate system having three axes ($E_x$, $E_y$, $E_z$) that are orthogonal with respect to one another. The axis $E_z$ points in a radial direction away from the center of gravity of the earth, as a result of which the gravitational pull or force of gravity, which is denoted by the vector $\vec{g}$ in FIG. 9, is directed against the axis $E_z$. The axis $E_y$ points to the geomagnetic North Pole. The magnetometer D is equipped with three gravitation sensors, the output signal from each of which is proportional to a component of the gravitational pull or force of gravity in three spatial directions that are orthogonal with respect to one another. Similarly, the magnetometer D is equipped with three magnetic field sensors.

The orientation of the magnetometers D in the reference coordinate system ($E_x$, $E_y$, $E_z$) is indicated by an internal coordinate system ($D_x$, $D_y$, $D_z$) that is rigidly coupled to the magnetometer D. In FIG. 9a, the magnetometer D is oriented such that its internal coordinate system ($D_x$, $D_y$, $D_z$) is oriented coaxially with respect to the reference coordinate system ($E_x$, $E_y$, $E_z$). At the same time, the axes ($D_x$, $D_y$, $D_z$) correspond to the directions of measurement of the three gravitation sensors and of the three magnetic field sensors, which are symbolized by the vectors $\vec{g}_1$, $\vec{g}_2$, $\vec{g}_3$ and $\vec{m}_1$, $\vec{m}_2$, $\vec{m}_3$ in FIGS. 6 and 7. In the orientation of the magnetometer D that is shown in FIG. 9a, which is coaxial with respect to ($E_x$, $E_y$, $E_z$), only the output signal from the gravitation sensor oriented in the direction $D_z$ is different than zero.

In FIG. 9b, the magnetometer D is tilted or rotated in comparison with its orientation in FIG. 9a, the axes of the internal coordinate system of the magnetometer being indicated by ($D'_x$, $D'_y$, $D'_z$). Like any rotation in three-dimensional space, the rotation of the magnetometer from the orientation ($D_x$, $D_y$, $D_z$) into the orientation ($D'_x$, $D'_y$, $D'_z$) can be described as rotation through an angle α about an axis that is perpendicular to a plane N. The plane N, which is denoted by shading in FIG. 9b, is defined by the axis $E_z$ or the direction $\vec{g}$ and the axis $D'_z$. If $\hat{n}$ denotes the normal vector of the plane N, the rotation of the magnetometer can be represented mathematically by a matrix $R(\hat{n},\alpha)$ having the following elements:

$$\hat{n} = (n_x \cdot n_y, n_z) \text{ with } n_x^2 + n_y^2 + n_z^2 = 1$$

$$R(\hat{n}, \alpha) = \begin{pmatrix} n_x^2(1-\cos\alpha)+\cos\alpha & n_xn_y(1-\cos\alpha)-n_z\sin\alpha & n_zn_x(1-\cos\alpha)+n_y\sin\alpha \\ n_xn_y(1-\cos\alpha)+n_z\sin\alpha & n_y^2(1-\cos\alpha)+\cos\alpha & n_yn_z(1-\cos\alpha)-n_x\sin\alpha \\ n_zn_x(1-\cos\alpha)-n_y\sin\alpha & n_yn_z(1-\cos\alpha)-n_x\sin\alpha & n_z^2(1-\cos\alpha)+\cos\alpha \end{pmatrix}$$

The operation that is the inverse of $R(\hat{n},\alpha)$, rotating the magnetometer D back into its original orientation (see FIG. 9a), is described mathematically by the matrix $R(\hat{n},-\alpha)$.

In the magnetometer orientation ($D'_x$, $D'_y$, $D'_z$) that is shown in FIG. 9b, the output signals from the three gravitation sensors are each proportional to the components ($g'_x$, $g'_y$, $g'_z$) of the gravitational pull $\vec{g}$ in the direction of the three axes ($D'_x$, $D'_y$, $D'_z$). The elements of the matrix $R(\hat{n},\alpha)$ or $R(\hat{n},-\alpha)$ can easily be calculated using the following relationships:

$$\vec{g} = (g'_x, g'_y, g'_z)$$

$$\hat{n} = \frac{1}{\sqrt{(g'_x)^2 + (g'_y)^2}} (g'_y, -g'_x, 0)$$

$$\alpha = \arccos\left(\frac{g'_z}{\sqrt{(g'_x)^2 + (g'_y)^2 + (g'_z)^2}}\right)$$

Furthermore, in the magnetometer orientation ($D'_x$, $D'_y$, $D'_z$) shown in FIG. 9b, the output signals from the three magnetic field sensors are each proportional to the components ($m'_x$, $m'_y$, $m'_z$) of the Earth's magnetic field in the direction of the three axes ($D'_x$, $D'_y$, $D'_z$). The vertical and horizontal components of the Earth's magnetic field can be calculated by multiplying the vector ($m'_x$, $m'_y$, $m'_z$) by the matrix $R(\hat{n},-\alpha)$, which equates to rotation of the magnetometer D from the orientation ($D'_x$, $D'_y$, $D'_z$) into the orientation ($D_x$, $D_y$, $D_z$). In this case, the vector $\vec{m}'=(m'_x,m'_y,m'_z)$ is transformed into the vector, $\vec{m}=(m_x,m_y,m_z)$
i.e. $\vec{m}=R(\hat{n},-\alpha)*\hat{m}'$
where $m_z$ represents the vertical component and ($m_z,m_y$) or $\sqrt{m_x^2+m_y^2}$ represents the horizontal component of the Earth's magnetic field.

The above-described calculation of the vertical and horizontal components of the Earth's magnetic field presupposes that the output signals from the three gravitation sensors and the three magnetic field sensors are electronically calibrated relative to one another. The gravitation sensors are calibrated with one another by successively orienting the magnetometer D or each of the three gravitation sensors, i.e. the internal coordinate axes ($D_y$, $D_y$, $D_z$), in the direction of gravitational pull or force of gravity $\vec{g}$ and recording the output signal from the relevant gravitation sensor. Subsequent to this, depending on the level of the recorded output signal, an individual calibration factor is determined such that the product of the respective level and the respective calibration factor is the same for all three gravitation sensors. The three calibration factors of the gravitation sensors are held in a nonvolatile memory and are used for calculating the matrix $R(\hat{n},-\alpha)$ or for calculating the normal vector $\hat{n}$ and the angle of rotation $\alpha$. Similarly, the magnetic field sensors are calibrated relative to one another by successively orienting the magnetometer D or each of the three magnetic field sensors, i.e. the internal coordinate axes ($D_x$, $D_y$, $D_z$) of the magnetometer, in a prescribed direction, in particular horizontally, to the geomagnetic North Pole and recording the output signal from the relevant magnetic field sensor. Subsequent to this, depending on the level of the recorded output signal, an individual calibration factor is determined such that the product of the respective level and the respective calibration factor is the same for all three magnetic field sensors.

That which is claimed:

1. A dynamically compensating apparatus for the contactless detection of vehicles comprising one or more magnetometers for measuring the geomagnetic field, said magnetometers fitted either in a carriageway surface or below one or more ceilings of a parking garage by retaining elements, wherein the at least one magnetometer comprises a device for measuring the gravitational field and the apparatus further comprises one or more electronic evaluation modules that are equipped with an integrated circuit, a digital signal processor, a Field Programmable Gate Array or an Application Specific Integrated Circuit, and are connected to or integrated with the at least one magnetometer,
   wherein the apparatus comprises one or more groups of magnetometers, each group comprising two, three, four or more magnetometers arranged at a distance from one another in a direction of travel that is prescribed by transport engineering,
   each of the magnetometers comprises at least one magnetic field sensor and at least one gravitation sensor which have been electronically calibrated relative to one another,
   and a software or firmware program having a geometric algorithm for calculating the vertical and/or horizontal component of the geomagnetic field based on measurements taken at a frequency of a few Hertz to a few tens of thousands of Hertz.

2. The apparatus as claimed in claim 1, wherein the integrated circuit is a microprocessor.

3. The apparatus as claimed in claim 1, wherein the at least one electronic evaluation module comprises a nonvolatile digital memory.

4. The apparatus as claimed in claim 3, wherein the nonvolatile digital memory is a Flash EEPROM.

5. The apparatus as claimed in claim 1, wherein the at least one magnetic field sensor is an integrated electronic circuit.

6. The apparatus as claimed in claim 1, wherein the at least one magnetic field sensor is based on the magnetoresistive (MR), anisotropic magnetoresistive (AMR), giant magnetoresistive (GM R), tunnel magnetoresistive (TMR) or giant magnetic inductance (GMI) effect or wherein the at least one magnetic field sensor is in the form of a fluxgate magnetometer or Förster probe.

7. The apparatus as claimed in claim 1, wherein each of the magnetometers comprises three gravitation sensors that are arranged such that the output signals from the three gravitation sensors are each proportional to the force of gravity in three spatial directions that are not coaxial with respect to one another.

8. The apparatus as claimed in claim 7, wherein the three spatial directions that are not coaxial with respect to one another are orthogonal with respect to one another.

9. The apparatus as claimed in claim 1, wherein the at least one gravitation sensor is in the form of a microelectromechanical component (MEMS).

10. The apparatus as claimed in claim 1, wherein the apparatus comprises one or more of(i) a software or firmware program having a geometric algorithm for calculating at least one of the vertical or horizontal component of the geomagnetic field; (ii) a bus system; (iii) at least one of either a reception and transmission unit for a mobile radio or a reception and transmission unit for Ethernet; and (iv) the at least one magnetometer is connected to the at least one electronic evaluation module via the Internet.

11. The apparatus as claimed in claim 10, wherein the bus system is a CAN bus.

12. The apparatus as claimed in claim 1, wherein said magnetometers are arranged below a surface of a carriageway or a parking lot.

13. The apparatus as claimed in claim 1, wherein said apparatus further comprises a solar panel and also a battery or a storage battery.

14. The apparatus as claimed in claim 13, wherein said apparatus further comprises an evaluation module and a communication interface integrated in the magnetometer.

15. The apparatus as claimed in claim 1, wherein said magnetometer is disposed in a groove in the carriageway, foam covers or envelopes the magnetometer, and asphalt, bitumen or concrete fills and seals the groove containing the foam covered magnetometer.

16. The apparatus as claimed in claim 1, wherein said magnetometers are fitted below more than one ceiling of the parking garage and only every other story is equipped with said magnetometers and all vehicles and vehicle movements within the parking garage are sensed.

17. A dynamically compensating apparatus for the contactless detection of vehicles comprising one or more magnetometers for measuring the geomagnetic field, wherein the at least one magnetometer comprises a device for measuring the gravitational field and the apparatus further comprises one or more electronic evaluation modules that are equipped with an integrated circuit, a digital signal processor, a Field Programmable Gate Array or an Application Specific integrated Circuit, and are connected to or integrated with the at least one magnetometer, the apparatus comprises one or more groups of magnetometers, each group comprising one, two, three, four or more magnetometers arranged at a distance from one another in a direction of travel that is prescribed by transport engineering, wherein each of the magnetometers comprises three magnetic field sensors that are arranged such that the output signals from the three magnetic field sensors are each proportional to the magnetic field strength in three spatial directions that are not coaxial with respect to one another, and three gravitation sensors that are arranged such that the output signals from the three gravitation sensors are each proportional to the force of gravity in three spatial directions that are not coaxial with respect to one another.

18. The apparatus as claimed in claim 17, wherein the three spatial directions are orthogonal with respect to one another.

19. A method for the contactless detection of vehicles, comprising the following steps:
(a) providing one or more apparatuses as claimed in claim 1 comprising one or more magnetometers for measuring the geomagnetic field and the gravitational field and also one or more electronic evaluation modules, wherein the magnetometers are arranged above or below the surface of a carriageway or a parking lot and are connected to the at least one evaluation module;
(b) transmitting the output signals from the magnetometers to the at least one evaluation module; and
(c) software-assisted processing of the output signals from the magnetometers in the at least one evaluation module and translating into readout signals.

20. The method as claimed in claim 19, wherein said method further comprises transmitting the readout signals produced in step (c) to an electronic control and/or information system by wire, by optical fiber or wirelessly.

21. The method as claimed in claim 19, wherein the magnetic field strength is measured in three spatial directions that are not coaxial with respect to one another and/or the gravitation or force of gravity is measured in three spatial directions that are not coaxial with respect to one another.

22. The method as claimed in claim 21, wherein the magnetic field strength is measured in three spatial directions that are orthogonal with respect to one another, and/or the gravitation or force of gravity is measured in three spatial directions that are orthogonal with respect to one another.

23. The method as claimed in claim 19, wherein step (c) further comprises calculating the vertical and/or horizontal component of the geomagnetic field from the strength and direction of the geomagnetic field, which are measured using the at least one magnetometer, on the basis of a geometric transformation, the parameters of which are determined from the strength and direction of the gravitational field as measured using the magnetometer.

24. The method as claimed in claim 19, wherein said steps (b) and (c) further comprise one or more of (i) transmitting the output signals from two, three, four or more magnetometers arranged at a distance from one another in a direction of travel that is prescribed by transport engineering to the evaluation module and processing in order to produce readout signals; and (ii) transmitting the output signals from one or more magnetometers arranged above or below a first parking space in a parking lot and the output signals from one or more magnetometers arranged above or below one or more of a second, third and fourth parking space in the parking lot to the evaluation module and processing in order to produce readout signals, the second, third and fourth parking spaces being adjacent to the first parking space.

25. The method as claimed in claim 19, wherein step (c) further comprises processing the output signals via a knowledge-based algorithm.

26. A traffic control system comprising one or more apparatuses as claimed in claim 1 and one or more control devices, signal apparatuses and/or information systems connected to the at least one apparatus.

27. A traffic control system as claimed in claim 26, wherein said control devices, signal apparatuses and/or information systems are selected from traffic lights, light signal installations, barriers and navigation systems.

* * * * *